United States Patent
Munnan et al.

(10) Patent No.: US 8,803,716 B1
(45) Date of Patent: Aug. 12, 2014

(54) MEMORYLESS SLIDING WINDOW HISTOGRAM BASED BIST

(71) Applicant: STMicroelectronics International N.V., Amsterdam (NL)

(72) Inventors: Ravindranath Ramalingaiah Munnan, Bangalore (IN); Raghu Ravindran, Bangalore (IN); Ravi Shekhar, Bangalore (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/859,954

(22) Filed: Apr. 10, 2013

(51) Int. Cl.
*H03M 1/10* (2006.01)

(52) U.S. Cl.
USPC ........... 341/120; 341/155; 375/350; 714/718; 714/731; 714/740; 714/733; 714/724; 714/734; 714/738; 714/742; 714/E11.154; 714/E11.169; 324/750.3; 324/762.02; 382/313; 348/294; 348/302; 348/E5.091; 702/57; 702/69; 702/180

(58) Field of Classification Search
CPC ......... H03M 1/12; H03M 1/66; H03M 1/109; H03M 1/1085; H03M 1/1028; H03M 1/1095; H04N 5/378; H04N 5/3559; G01R 31/3167; G01R 31/3187; G01R 31/31727; H03K 4/90; H03K 4/501; G06K 9/24; G06K 9/228; G06F 11/24; G06F 9/30014; G06F 9/30032; G06F 9/30036; G06F 9/30043; G06F 9/30145; H04L 49/90
USPC .......................... 341/118, 120, 109, 169, 155; 324/750.3, 762.02; 714/718, 731, 740, 714/733, 724, 734, 738, 742, E11.154, 714/E11.155, E11.169; 375/350; 382/313; 348/294, 302, E5.091; 702/57, 69, 180
See application file for complete search history.

(56) References Cited

U.S. PATENT DOCUMENTS

| | | | | |
|---|---|---|---|---|
| 5,659,312 | A * | 8/1997 | Sunter et al. | 341/120 |
| 6,211,803 | B1 * | 4/2001 | Sunter | 341/120 |
| 6,557,131 | B1 * | 4/2003 | Arabi | 714/734 |
| 6,642,870 | B1 * | 11/2003 | Renovell et al. | 341/120 |
| 6,987,472 | B2 * | 1/2006 | Lin | 341/120 |
| 7,129,734 | B2 * | 10/2006 | Geiger et al. | 324/750.3 |

(Continued)

OTHER PUBLICATIONS

IEEE Std 1241-2000, "Standard for Terminology and Test Methods for Anaglog-to-Digital Converters," Dec. 7, 2000 (98 pages).

(Continued)

*Primary Examiner* — Lam T Mai
(74) *Attorney, Agent, or Firm* — Gardere Wynne Sewell LLP

(57) ABSTRACT

A chip with a built-in self-test (BIST) component capable of testing the linearity of an ADC is described herein. The BIST component uses hardware registers to facilitate a sliding histogram technique to save space on the chip. A subset of detected digital codes are analyzed, and DNL and INL calculations are performed by a controller to determine whether any of the digital codes in the subset exceed maximum or minimum DNL and INL thresholds. New digital codes being detected by the ADC are added to the subset as lower-value digital codes are pushed out of the subset, maintaining the same number of digital codes being analyzed as the subset moves from lower codes detected during lower voltages to higher codes detected at higher voltages. A synchronizer and pointer ensure that the subset moves through the digital codes at the same rate as the analog input ramp source.

30 Claims, 7 Drawing Sheets

(56) References Cited

U.S. PATENT DOCUMENTS

| | | | |
|---|---|---|---|
| 7,154,422 B2 * | 12/2006 | Wen | 341/120 |
| 7,539,916 B2 * | 5/2009 | Kanter et al. | 714/731 |
| 7,567,279 B2 * | 7/2009 | Yourlo et al. | 348/294 |
| 7,587,647 B2 * | 9/2009 | Olleta et al. | 714/740 |
| 7,603,602 B2 * | 10/2009 | Chang | 714/733 |
| 8,106,801 B2 * | 1/2012 | Dasnurkar | 341/120 |
| 8,223,048 B2 * | 7/2012 | Wilhite | 341/120 |
| 8,310,385 B2 * | 11/2012 | Dasnurkar | 341/120 |
| 8,386,209 B2 * | 2/2013 | Mullane et al. | 702/123 |
| 8,510,073 B2 * | 8/2013 | Dasnurkar | 702/117 |
| 8,682,613 B2 * | 3/2014 | Hamilton et al. | 702/180 |

OTHER PUBLICATIONS

IEEE Std 1057-1 994, "Standard for Digitizing Waveform Recorders," Dec. 30, 1994 (81 pages).

Chapter 3, "Data Converter Architectures," http://www.analog.com/library/analogDialogue/archives/39-06/Chapter%203%20Data%20Converter%20Architectures%20F.pdf (142 pages).

Chapter 5 "Testing Data Converters," http://www.analog.com/library/analogDialogue/archives/39-06/Chapter%205%20Testing%20Converters% (94 pages).

* cited by examiner

MEMORYLESS SLIDING WINDOW HISTOGRAM BASED BIST

BACKGROUND

The analog-to-digital converter (ADC) is one of the most frequently used analog mixed signal (AMS) components today and is the primary limiter of a system on chip (SoC) due to the ADC's analog characteristics. AMS components are more prone to variations in process voltage temperature (PVT) than digital components, and performance can change from silicon to silicon. An ADC that outputs digital codes nonlinearly as voltage increases may be imprecise. Testing ADCs is therefore vital to ensuring quality control and minimizing defective parts in production.

Automated test equipment (ATE) has traditionally been used in semiconductor manufacturing to test an SoC after the chip is fabricated. The goal of any ATE is to find faults or manufacturing defects of electrical components of the SoC. Testing the analog components of every SoC coming out of fabrication is essential to maintaining quality control but ATEs are complex to develop and expensive due to the sophistication of the instrumentation needed. They typically require high run-times and ample memory for testing.

Built-in self tests (BISTs) provide a simpler way to test ADCs by moving testing equipment onto the chip itself. This simplicity is not without cost, however, as BISTs greatly add to chip complexity. Two general types of ADC BIST testing exist today: dynamic testing and static testing. Dynamic testing measures the spectral response of an ADC using sinusoidal input signals to capture signal-to-noise ratio (SNR), spurious-free dynamic range (SFDR), signal-to-noise and distortion (SINAD), and intermodulation distortion (IMD). Fast Fourier transformation is used, requiring unacceptably large overhead taking up valuable chip space. Static testing measures the difference on a histogram between an ADC's real output (i.e., the translation of an analog signal to a digital output) and the ideal output for different voltage levels. Once mapped as a histogram, the actual output of the ADC is compared to an ideal staircase-like output in order to calculate the integral nonlinearlity (INL) and differential nonlinearlity (DNL) between the two. Like dynamic testing, histogram-based static testing uses an inefficiently large amount of resources on an SoC.

Moreover, traditional methods of implementing histogram-based linearity testing involve a memory of magnitude $2^N$ or $2^N-2$ to be precise. The size of the requisite memory varies based on the number of hits-per-code (HPC) the ADC generates. A 12-bit ADC with average HPC equal to 200 would require 4096*8 bits=32 Kbytes. To implement such a huge memory in an application-specific integrated circuit (ASIC), one has to use high density logic (HDL) memories. Yet, HDL memories have the disadvantage of not being able to read and write data in the same location simultaneously in one clock cycle. Incrementing a value in a memory location would require 2 clock cycles (1 read+1 write). Waiting for two clock cycles to increment a value in memory is not an optimal use of resources.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

One aspect is related to a BIST component capable of testing the effectiveness of an ADC. This BIST component functions without traditional memory, instead using hardware registers to facilitate a sliding histogram technique, saving space on the SoC by not requiring large amounts of memory. A numerically controlled oscillator NCO is used to synchronize the sliding histogram with an input voltage ramp to ensure all ADC output codes are captured and none are detected outside of the sliding-histogram window. By programming the step size of the NCO, the sliding-histogram window moves at the same rate as the ramp input voltage. The BIST component determines whether the tested ADC is functioning properly or is defective due to detected nonlinear characteristics by calculating the differential nonlinearity (DNL) and integral nonlinearity (INL) for each digital code generated by in response to an input voltage. In one embodiment, the DNL and INL values for each digital output code are compared with maximum and minimum DNL and INL values. The ADC may be declared to be defective if the DNL or INL values exceed the maximum or minimum DNL or INL, either once or a certain number of times.

Another aspect is directed to linearity testing of an ADC using a sliding window-based histogram model. An ADC receives an input analog voltage and produces digital codes as outputs as the analog voltage ramps from an initial value to a full-scale voltage. A BIST component uses a window synchronizer to determine a subset of digital codes for calculating DNL and INL calculations for a particular subset of the digital codes being produced by the ADC based on the number of times each code was generated by the ADC. The BIST component also determines whether any of the DNL calculations calculated in the subset of digital codes exceeds a DNL maximum or is less than a DNL minimum, and if so, one or more counters are incremented. The digital codes in the subset are continually changed and DNL values constantly calculated until eventually all digital codes from the ADC have been analyzed. A determination is made as to whether the ADC is defective based on the counter values indicating how many digital codes produced DNL calculations exceeding the DNL maximum or less than the DNL minimum.

Another aspect is directed to testing an ADC using a built-in self-test. An input analog voltage is provided to the ADC and incrementally increased. An indication to begin ADC testing is received, triggering a state machine to being supplying the ADC with an analog input voltage. The input voltage is incrementally ramped from an initial value (e.g., 0) to a full-scale voltage (FS) properly test all ADC digital output codes of the ADC are generated in a linear fashion. The indication may be initiated by a user or programmatically by a device in a testing facility. While the input voltage is being ramped, a subset of the digital codes is selected, and DNL and INL calculations are performed for each digital code in the subset. One particular embodiment stores the DNL and INL calculations for each digital code in hardware registers instead of external memory, saving space on the SoC. The digital output codes are added and removed from the subset as the input voltage ramps up.

For each newly added digital output code in the subset, DNL and INL values are calculated and checked against maximum and minimum DNL and INL values, which are either preset or based on the average number of times previous digital codes have been detected. The subset is continually updated with new digital codes until all digital codes are analyzed. Counters or other accumulators are incremented whenever calculated DNL or INL values for a produced digital output code respectively exceed maximum and minimum DNL or INL values, and after all digital output codes have been analyzed, a determination is made as to whether the ADC is defective based on the counter values. The ADC may be deemed to be defective if the counter exceeds a threshold number, indicating the ADC experienced an unacceptable number of digital output codes that exceeded the DNL or INL maximum and minimum values.

The foregoing and other features and advantages of the present disclosure will become more apparent from the following detailed description of the embodiments read in conjunction with the accompanying drawings. The detailed description and drawings are merely illustrative of some different embodiments, rather than limiting the scope of the invention as defined by the appended claims and equivalents thereof.

DETAILED DESCRIPTION OF THE DRAWINGS

Figure 1:
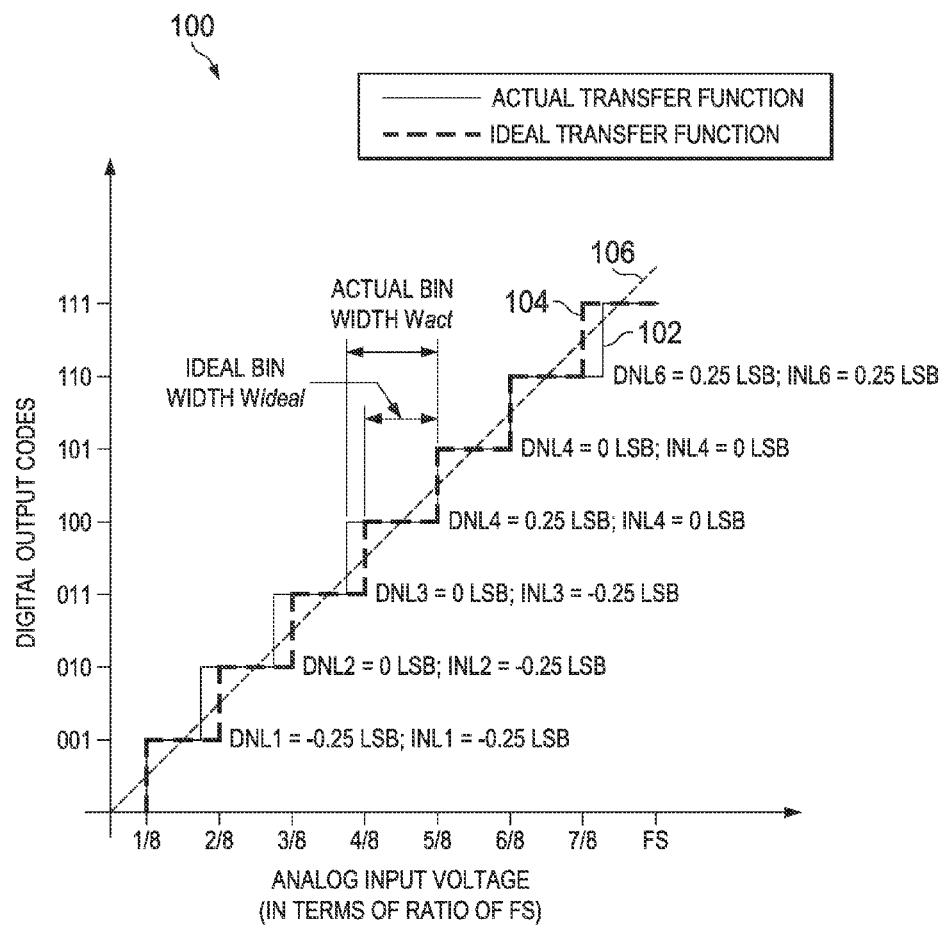
FIG. 1 illustrates a graphical representation of a graph indicating the nonlinearity characteristics of an ADC, according to one embodiment.

The following table of acronyms is provided to help the reader understand the embodiments described herein:

| | |
|---|---|
| ADC | analog-to-digital convertor |
| AMS | analog mixed signal |
| ATE | automated test equipment |
| BIST | built-in self-test |
| DNL | differential nonlinearity |
| FS | full scale voltage |
| HPC | hits per code |
| INL | integral nonlinearity |
| LSB | least significant bit |
| NCO | numerically controlled oscillator |
| PVT | process voltage temperature |
| SoC | system on Chip |

Histogram testing of an ADC involves collecting a large set of ADC samples over a certain period of time, with a known input signal and with a known probability density function of code occurrences. An ADC transfer function is determined by a statistical analysis of the samples. One embodiment applies a linearly ramped analog voltage input to an ADC and counts the number of times each code is counted as the voltage increases to FS. An ideal ADC with no INL/DNL errors has a probability of each code equaling the same, meaning the number of times any code occurs will be the same. To compute deficiencies of a tested ADC, one embodiment determines the average number of times each ADC output code is generated by the ADC, and then uses that average to calculate DNL and INL characteristics of the ADC. A BIST component can then determine whether the ADC is faulty based on the DNL and INL calculations.

Embodiments described herein generally relate to a BIST component capable of testing the effectiveness of an ADC. This BIST component functions without traditional memory, relying instead on hardware registers and a sliding histogram technique that saves space on the SoC. An ADC is supplied an input analog voltage that is incrementally increased to FS, and the corresponding ADC digital codes are analyzed as the voltage changes to determine whether the ADC experiences any nonlinear characteristics. These nonlinear characteristics indicate whether the tested ADC is functioning properly or is defective. Digital codes of a tested ADC are computed over the entire dynamic ramp voltage range and compared with maximum and minimum DNL or INL thresholds to determine whether the ADC is defective. For the sake of clarity, digital codes from the ADC are referred to herein as "Bins" or "Bin codes," with both terms being synonymous for purposes of this disclosure.

In one embodiment, testing the ADC involves first specifying a subset of the Bins to test, such as the first 64 codes in a 12-bit ADC. The number of times each Bin in the subset is detected is stored in a hardware register, and DNL and INL calculations are made for each Bin in the subset based on an average number of hits-per-code for all the Bins in the subset. The subset of Bin codes is merely a small sampling of all the Bin codes the ADC can produce—i.e., all 0's to all 1's. For instance, an 8-bit ADC may have 256 possible Bins, but the subset may only detect HPC and compute relative DNLs and INLs for just 64 Bins at a time of the 256 Bins.

After computing DNLs and INLs for a first subset of Bins, a second subset of Bins is selected, e.g., the next 64 Bins or an additional Bin is added while a current Bin is removed. In other words, the histogram window covers a subset of Bins, and after DNL and INL calculations are performed, another subset or group of the same number of Bins is selected for DNL and INL computations. In one embodiment, each subset consists of the same quantity of Bins, and the subsets progress until all Bins have been checked for extreme DNL valuations. This procedure allows embodiments to merely calculate the DNL and INL values for smaller subsets of the Bins at a time and effectively covering all the Bins by progressing from an initial subset to the final subset.

One embodiment uses a synchronization pointer to identify a midpoint Bin of a subset in which DNL and INL values are being calculated. Once DNL and INL calculations have been computed for each Bin in the subset, the synchronization pointer points to another Bin in the overall set of Bins and performs DNL and INL calculations for a new subset of the Bins. This procedure is iteratively performed until all Bins have been analyzed.

While discussed in more detail below, DNL and INL calculations for each Bin are based on the HPC detected as an AC source voltage is ramped from a certain value to FS. Additionally, maximum and minimum DNL calculations are figured, in one embodiment, based on the most and least HPC for the Bins in a subset of the Bins. For example, a subset of Bins yielding a high DNL of 0.75 LSB and a low DNL of –0.5 LSB will accordingly set the maximum and minimum DNL to those two values. Thereafter, any Bin having a DNL greater or less than the maximum and minimum DNLs, respectively, will cause one embodiment to increment a counter on a hardware register used to determine whether the corresponding ADC is defective, change the maximum and minimum DNL values, or both. In another embodiment, the maximum and minimum DNL values may be preset instead of being a function of the detected HPC, and any calculated DNL may be compared thereto to increment the hardware counter.

FIG. 1 illustrates a graph indicating the nonlinearity characteristics of a 3-bit ADC, according to one embodiment. Graph 100 maps the digital output binary or hexadecimal codes produced by an ADC for different voltage steps of a ramp AC voltage source.

The transfer function for an ideal ADC is a staircase in which each step represents a particular digital output code and each riser represents a transition between adjacent codes. The input voltages corresponding to these transitions must be located to specify an ADC's performance parameters. This chore can be complicated, especially for noisy transitions found in high-speed converters and for digital codes that are near the final result and changing slowly. So embodiments employ a sliding BIST window in which to count the number of Bin codes generated for a sample of step voltages, and the resultant Bin codes for each sample are stored in a read-out memory registers on the BIST and used in calculating DNL and INL characteristics for the ADC being tested.

As the increasing input voltage passes through a transition, the ADC converts more and more frequently to the next adjacent code. The transition corresponds to the input voltage for which the ADC converts an analog signal to a digital signal, with equal probability to each of the Bin codes. The right transition voltage is defined as the input voltage that has equal probabilities of generating either of the two adjacent codes. In one embodiment, nominal analog value, corresponding to the digital output code generated by an analog input in the range between a pair of adjacent transitions, is defined as the midpoint (50% point) of the voltage range. The transition point may be determined during test time by measuring the limits of the transition interval and then dividing the interval by the number of times each of the adjacent codes appears.

The Bins shown on the vertical axis graph 100 represent the different digital codes for a certain number of bits (N). Graph 100 shows N equaling 3, resulting in 8 ($2^3$) possible codes: 000, 001, 010, 011, 100, 101, 110, and 111. Along the x-axis, various increments of an applied ramp AC voltage are shown from 0 to the full scale voltage. The illustrated embodiment shows ⅛ increments of the AC voltage from 0 to full scale. If the full scale voltage were 1.8V, the depicted increments would equate to 0.23V (⅛), 0.45V (²⁄₈), 0.68V (⅜), 0.90V (⁴⁄₈), 1.13V (⅝), 1.35V (⁶⁄₈), 1.58V (⅞), and 1.8V (⁸⁄₈). Other embodiments may use different voltage increments, either uniform like ⅛ increments of FIG. 1 or increments that of varying step sizes, and, of course, full scale voltages other than 1.8V may be used.

Mapping the ADC's detected Bins at different increments of the AC source voltage produces actual transfer function 102 on graph 100. An ideal mapping of the when the Bins should be detected at different voltage increments produces ideal transfer function 104, shown as a dotted line.

DNL refers to the difference between an actual step width between increments of an input voltage and the ideal step of 1 LSB. An ideal ADC will have a DNL=0 LSB because each analog step equals 1 LSB (1 LSB=$V_{FS\ Voltage}/2^N$) and the transition values are spaced exactly 1 LSB apart. A DNL error specification of less than or equal to 1 LSB guarantees a monotonic transfer function with no missing codes. An ADC's monotonicity is guaranteed when digital output increases (or remains constant) with an increasing input signal, thereby avoiding sign changes in the slope of the transfer curve. DNL is specified after static gain error has been removed and is defined as follows:

$$DNL=|[(V_{D+1}-V_D)/V_{LSB-IDEAL}-1]|, \text{ where } 0<D<2^N-2$$

$V_D$ is the physical value corresponding to the digital output code D. N is the ADC resolution, and $V_{LSB-IDEAL}$ is the ideal spacing for two adjacent digital codes. By adding noise and spurious components beyond the effects of quantization, higher values of DNL usually limit the ADC's performance in terms of signal-to-noise ratio and spurious-free dynamic range.

As shown in graph 100, the width of transfer function step across input voltage (Bin width (W)) can be used to evaluate an ADC. Bin width refers to a step in the staircase pattern of the transfer functions across a limited input voltage range during which a digital output code is actually produced (actual transfer function 104) or should be produced (ideal transfer function 102). One embodiment calculates DNL for a given Bin code as the difference between a give Bin's actual Bin width ($W_{act}$) and the ideal Bin width ($W_{ideal}$) divided by the ideal Bin width ($W_{ideal}$):

$$DNL_i = W_{act} - W_{ideal}/W_{ideal}$$

For example, Bin code 010 should ideally be outputted by the depicted ADC between ⅜ and ⅜ of the full voltage, but according to actual transfer function 104, Bin code 010 was initially generated between ⅛ and ⅜ voltage and stopped being generated slightly before ⅜ voltage. An ideal ADC will step up or down one least significant bit (LSB), without skipping any level and without holding the same decimal number past two or three LSBs. In one embodiment, this implies an LSB voltage equal to the full scale voltage divided by $2^N$, with N representing the number of bits outputted by an ADC, as shown by the following formula:

$$ADC\ LSB\ Voltage = FS\ Voltage/2^N$$

In on embodiment, maximum and minimum DNL are computed for each Bin across the entire range of ADC voltages and compared with threshold DNLs calculated from ideal transfer function 102. If the actual DNL exceeds the thresholds, the DNL test may be declared a failure or the ADC declared defective.

INL error is the deviation, in LSB or percent of FS, of an actual transfer function from straight line 106. INL error magnitude depends directly on the position chosen for straight line 106. INL can also be expressed as the sum of all DNLs computed for previous Bins:

$$INL_i = \sum_{j=1}^{i} DNL_j$$

For example, the INL of the fourth binary code (0011) in an eight-bit binary ADC comprise the sum of the DNLs associated with the three previous Bins (0000, 0001, and 0010). Other embodiments use different techniques for calculating INL, such as, for example, using a "best straight-line INL" or an "end-point INL." Best straight-line INL provides information about offset (intercept) and gain (slope) error, plus the position of actual transfer function 104, determining, in the form of straight line 106, the closest approximation to the ADC's actual transfer function. End-point INL passes straight line 106 through end points of the ADC's transfer function, thereby defining a precise position for the line.

Thus, straight line 106 for an N-bit ADC is defined by zero (all zeros) and full-scale (all ones) outputs.

In one embodiment, INL is measured after both static offset and gain errors have been nullified, and can be described as follows:

$$INL=[(V_D-V_{ZERO})/V_{LSB-IDEAL}]-D$$

$V_D$ is the analog value represented by the digital output code D, N is the ADC's resolution. $V_{ZERO}$ is the minimum analog input corresponding to an all-zero output code. $V_{LSB-IDEAL}$ is the ideal spacing for two adjacent output codes.

One embodiment excludes input voltages at certain thresholds in the upper and lower ends of the voltage range because such voltages do not have bounded input ranges and consequently result in all 0's (clipping) or all 1's (saturation). For example, some embodiments would ignore results for voltages below ⅛ FS and above ⅞ FS in graph 100. The thresholds may vary based on the incremental voltage steps, the ADC being measured, specific Bin codes (e.g., all 0's or all 1's), a percentage of either or both, or a combination thereof.

Actual transfer function 104, when measured relative to ideal transfer function 102, results in various DNL and INL calculations across the different Bin codes of the 3-bit ADC depicted in graph 100. In the shown embodiment, DNL and INL calculations are not computed for initial Bin 000 and final Bin 111. Transfer function 104 produces the following DNL and INL calculations for each Bin: DNL1 of −0.25 LSB and INL1 of −0.25 LSB at Bin 001, DNL2 of 0 and INL2 of −0.25 LSB at Bin 010, DNL3 of 0 and INL3 of −0.25 LSB at Bin 011, DNL4 of 0.25 LSB and INL4 of 0 at Bin 100, DNL5 of of 0 and INL5 of 0 at Bin 101, and DNL6 of 0.25 LSB and INL6 of 0.25 LSB at Bin 110.

Some ADC's may entirely miss a digital code during a certain voltage. For example, a 3-bit ADC may measure codes 000, 001, 010, 100, 101, and 111—thus missing code 011—as a voltage is incrementally ramped from 0 to FS. Missing codes, as discussed herein, refer to a Bin that was never generated by the ADC. Considering the aforementioned example, Bin code 011 may be considered a missing code because it was either never detected or has a DNL greater than 0.8 LSB. While different DNL thresholds may be used to label a missing code, at least one embodiment uses DNLs greater than 0.9 LSB as the cutoff.

Figure 2:
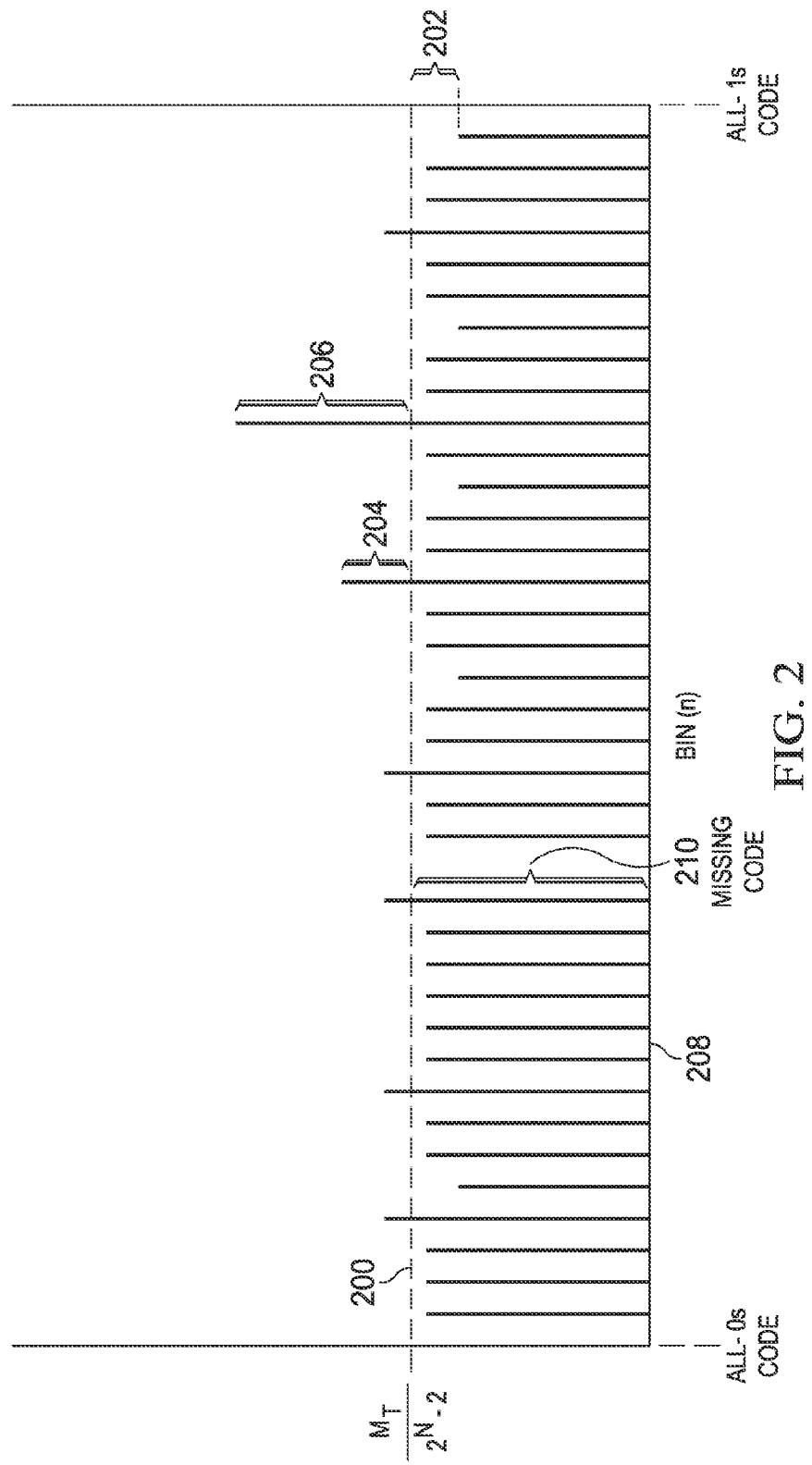
FIG. 2 illustrates a representation of a graph indicating digital codes of N bits detected by an ADC, according to one embodiment.

FIG. 2 illustrates a graphical representation of digital codes (Bins) of N bits detected by an ADC, according to one embodiment. The graph in FIG. 2 plots the number of times each Bin code is detected, referred to herein as the "Bin sample size," while a voltage source was ramped to FS. Each bar represents an individual Bin (e.g., 0000, 0001, etc.), with the height of each bar indicating the number the times the Bin was produced by the ADC. Ideally, histogram bars would all be the same height, indicating the ADC is generating each Bin at the correct ramp voltage. Average Bin Sample Size 200 indicates the average number of times each Bin was generated by the ADC, computed by dividing the total number of code samples ($M_T$) by the total number of Bin codes ($2^N-2$):

$$\text{Average Bin Sample Size} = M_T/(2^N-2)$$

The DNL for a given Bin can then be calculated, in one embodiment, by computing the difference between the Bin's count (i.e., the number of times a Bin was detected) and Average Bin Sample Size 200. Differentials 202, 204, 208, and 210 show differences between Bin counts and the Average Bin Sample Size 200 and represent DNL values. Though not shown, INL can be calculated by summing all the DNL values calculated for previous Bin codes. For example, if the there are eight total Bins, the INL value for the fourth Bin can be figured by summing the DNLs of the first, second, and third Bin. Other well-known techniques for computing DNL and INL may alternatively be used in different embodiments.

An ADC may be so defective or the ramp voltage so noisy that the ADC misses an entire code altogether. This is referred to herein as a "missing code" and is shown in FIG. 2 by a blank area 208 in the graph where a Bin sample should appear. Missing codes can result from noise in the analog voltage itself, noise introduced by the ADC, nonlinear ramping for the voltage source, or some other introduction of error to ADC testing.

Figure 3:
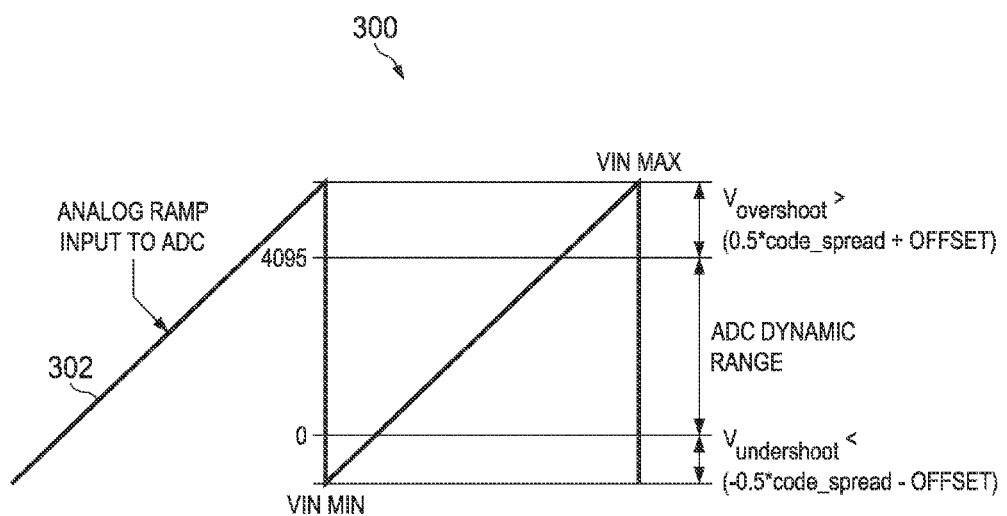
FIG. 3 illustrates a representation of ramp voltage requirements for DNL testing, according to one embodiment.

FIG. 3 illustrates a graphical representation of ramp voltage requirements for DNL testing of a twelve-bit ADC, according to one embodiment. The graphical representation includes graph 300 showing an analog ramp voltage 302 being used for testing DNL and INL for the ADCs. Ideally, analog ramp 302 is highly linear. In one embodiment, the voltage range and extra overshoot and undershoot required is based on two parameters. First, the voltage range should cover the entire dynamic range of ADC and beyond so as to ensure overflow and underflow occurs during testing. The ramp input to ADC should ensure the ADC output code covers 0 to $2^N-1$ (e.g., 4095 for twelve bits) even under worst-case offset error and gain error. Second, the overshoot and undershoot should be more than half the Bin code spread. This ensures that the ADC noise does not cause any ADC code other than 0 at the output when analog ramp voltage 302 begins. Similarly, when analog ramp voltage 302 is at FS the noise should not cause any ADC code other than $2^N-1$. To meet the above two parameters, one embodiment uses an overshoot and undershoot of the dynamic range of analog ramp 302 by 5%, as shown in graph 300. Embodiments are not limited to such specific ramp input overshooting and undershooting, as others may use different percentages (e.g., 3%, 4%, 7%, 10%, etc.), or simply use specific values (e.g., 0.2V, 0.5V, 0.7V, etc.).

Figure 4:
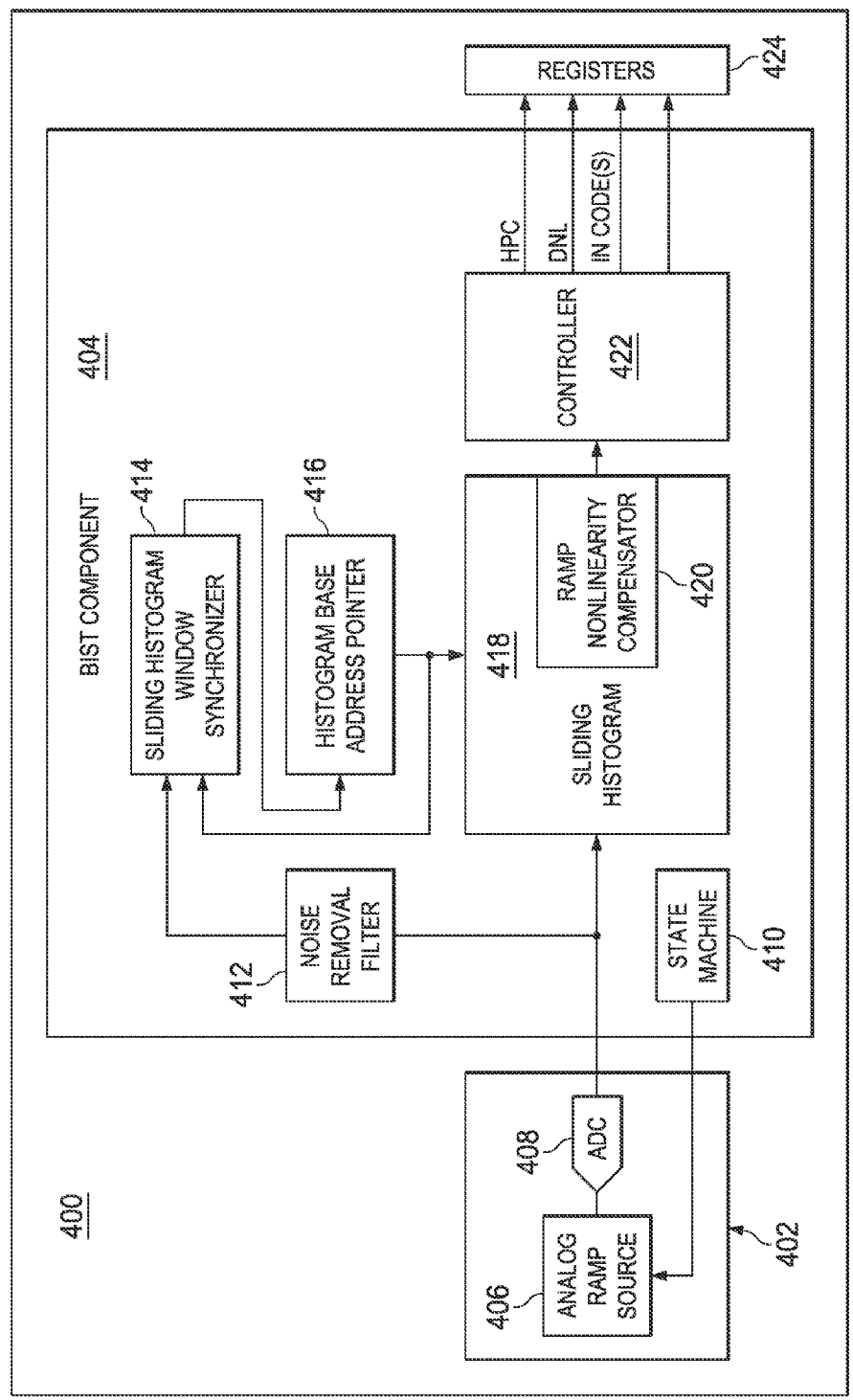
FIG. 4 illustrates a block diagram of a BIST on an SoC, according to one embodiment.

FIG. 4 illustrates a block diagram of a BIST on an SoC, according to one embodiment. SoC 400 includes an analog portion 402 and a digital BIST component 404. Analog portion 402 includes analog ramp voltage source 406 that is supplied to ADC 408. BIST component 404 includes state machine 410, noise removal filter 412, sliding histogram window synchronizer 414, histogram address pointer 416, sliding histogram 418, controller 422, and hardware registers 424. The shown components in SoC 400 are provided merely for explanatory purposes of one embodiment and are not meant to limit the invention to any particular hardware configuration. Alternative embodiments may include additional or alternate components to perform the functionality described herein.

State machine 410 directs analog ramp voltage source 406 to supply a particular voltage and also increase, or ramp-up, that voltage from zero, or some other initial voltage, to FS. State machine 410 may be triggered to begin ramping analog voltage source by a user through different user interfaces or programmatically by a device in a manufacturing facility.

State machine 410 may control analog ramp voltage source 406 during a calibration phase. Several steps are performed during the calibration phase that ensure the analog ramp voltage source 406 is functioning properly and is not subject to silicon-based variations. First, the ramp rate of analog ramp voltage source 406 is adjusted if a numerically controlled oscillator (NCO) configuration, which is not shown in FIG. 3, differs more than threshold amount from the actual ramped voltage being generated. For example, the ramp rate of analog ramp voltage source 406 may be adjusted if an NCO is configured to generate 0.1 V but the actual analog voltage is 0.3

V. Second, the differences between the actual ramp rate after any adjustment and the NCO step size are estimated. The NCO step size may be reconfigured to minimize the estimated difference. Third, the difference between actual analog voltage starting value and NCO initialization values are determined or estimated. NCO initialization values may be readjusted to minimize the difference. Some embodiments may skip all or some of the above three steps, or may add additional steps to ensure the analog ramp voltage source 406 is functioning properly.

Noise removal filter 412 comprises one or more filters that remove different types of noise from the output of ADC 408. In one embodiment, the output of ADC 408 passes through a 5-tap median filter and a 16-tap average filter to remove sparkle/glitch noise and random noise, respectively. Other finite impulse filters (FIRs) with different tap weights may alternatively be used.

After filtering, noise-free ADC data is supplied to sliding histogram window synchronizer 404, which in turn uses the noise-free ADC data to identify an initial subset of Bin codes for computing the DNL and/or INL calculations. Different embodiments will use different techniques for selecting the size of the subset of Bins based on storage space in register 424. The size of the subset may be hardcoded into the sliding histogram window synchronizer or may be dependent on the total number of Bin codes ($2^N-2$) associated with ADC 408.

Histogram base address pointer 416 indicates the ADC code of the initial Bin, which may be all 0's or another relatively low-number Bin, and directs sliding histogram 418 to begin performing DNL and INL calculations for a subset at the initial Bins. As sliding histogram 418 progresses through the Bins in the subsets, one embodiment increments the subset window of Bins (referred to herein as the "Bin window") to evenly progress through all Bins of the ADC at a rate coinciding with the ramp rate of the analog ramp voltage source 406. In other words, the Bin window includes a set number of Bin codes, but the Bin window progresses from the initial Bin to the final Bin by being incremented to remove the smallest Bin from the Bin window and add the next-largest Bin to the windows. For example, a 4-bit ADC may have a Bin window of three, resulting in an initial subset of Bins 000, 001, and 010, and as the voltage ramps, sliding histogram 418 removes Bin 000 and adds Bin 011 to make the new subset 001, 010, and 011. Incrementing in such a manner may occur from the initial Bin up to the final Bin.

Controller 422 represents an arithmetic logic unit (ALU) that computes the average HPC detected by ADC 408 for all Bins in a subset, as well as the DNL and INL for each Bin in the subset. In one embodiment, DNL calculation involves computing the average HPC for each Bin (referred to as "Qavg") across one full cycle of ramp voltage. In other words, analog ramp voltage source 406 is stepped between two voltages in a subset, and the HPC for each Bin code in the subset detected and averaged to create Qavg. Qavg for a 12-bit ADC may be computed according to the following formulas:

$$\text{Sum\_Qi} = \sum_{n=1}^{4093} Q_i$$

$$Q_{avg} = \left(\text{Sum}_{Qi} + \frac{\text{Sum}_{Qi}}{2048} + \frac{\text{Sum}_{Qi}}{4096}\right) \times \frac{1}{4096}$$

Alternatively, the BIST may be configured to calculate $Q_{avg}$ instead of simply programming $Q_{avg}$ into register 424. INL for a given Bin may be calculated by summing all previous DNLs in a subset.

Additionally, controller 422 determines maximum and minimum DNL values for a subset based on the largest positive and negative DNL values in the subset from the average HPC of the subset. In another embodiment, maximum and minimum DNL values may be predetermined and hard coded, instead of being calculated on the fly. HPC, DNL, INL, and maximum and minimum DNL and INL for a given subset may be stored in hardware registers 424. Registers 424 may include read-out registers, bit-specific register (e.g., 8-bit, 16-bit, 32-bit etc.), or the like. Moreover, new HPC, DNL, INL, maximum DNL, and minimum DNL values will be calculated and added to registers 424 as sliding histogram 418 moves to other subsets of the Bin codes.

Ramp nonlinearity compensator 420 provides a compensation value to be deducted from generated Bin hits of ADC 408 to compensate for the nonlinearity of the voltage provided by analog ramp voltage source 406. To this end, one embodiment actually manipulates the HPC values for different or all Bins based on the nonlinearity characteristics of a ramped input analog ramp voltage source 406.

Figure 5:
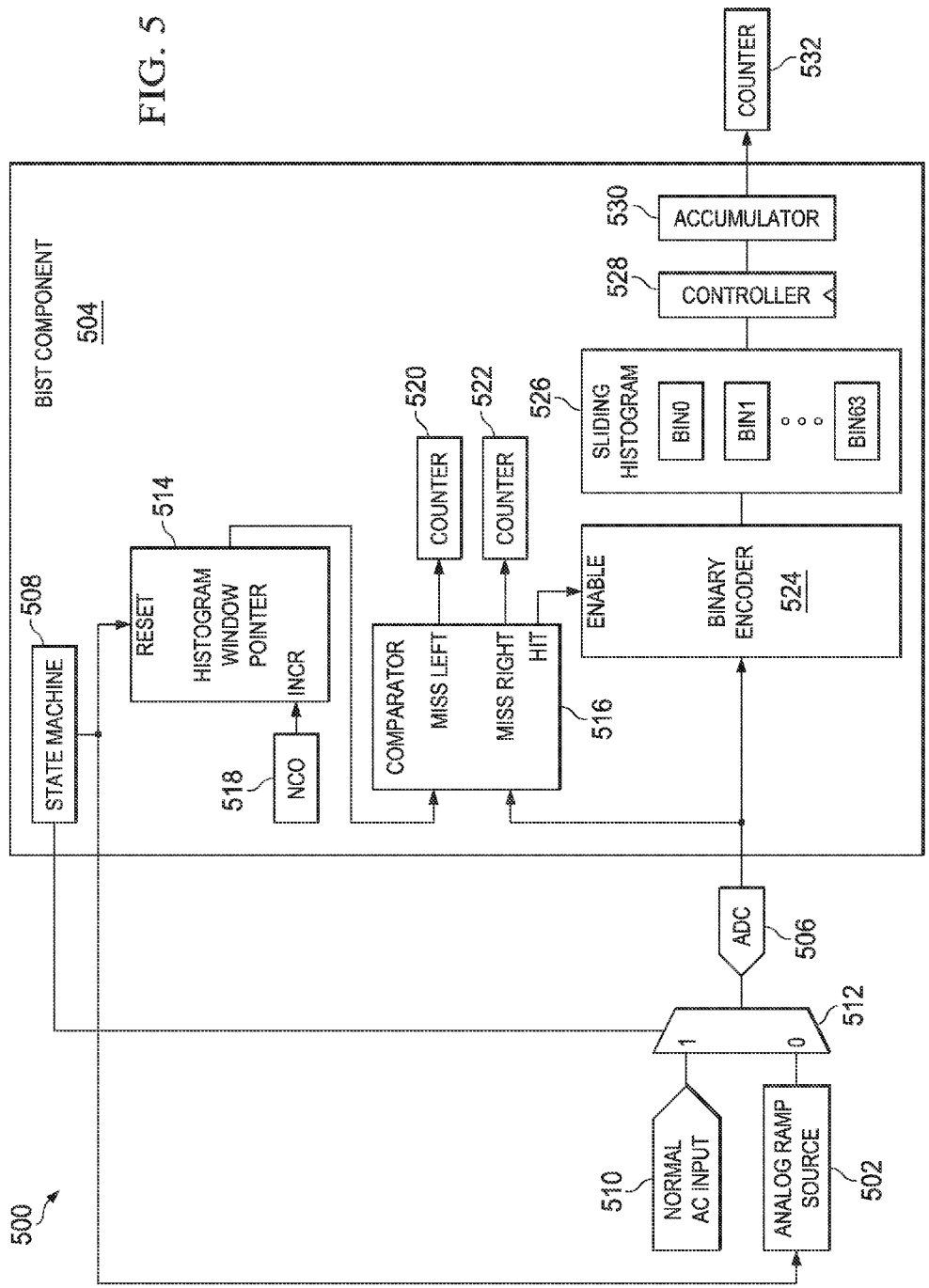
FIG. 5 illustrates a block diagram of a BIST on an SoC, according to one embodiment.

FIG. 5 illustrates a block diagram of a BIST on an SoC, according to one embodiment. SoC 500 includes analog ramp voltage source 502 controlled by state machine 508 in BIST component 504. State machine 508 may trigger ADC testing when prompted by a user or external programming device, and when triggered, multiplexer 512 switches which signal passes to ADC 506, from normal AC input 510 (i.e., the signal ADC 506 is configured to convert during normal functioning) to analog ramp source 502. In addition to controlling analog ramp voltage source 502, state machine 508 is a selector input to multiplexer 512, giving state machine 508 the ability to control when the analog voltage is supplied to ADC 506. As mentioned in previous embodiments, analog ramp voltage source 502 provides an analog voltage source that steps up from an initial value (e.g., 0 or a negative FS) to FS, and state machine 508 controls the incremental ramping of the analog voltage. The shown components in SoC 500 are provided merely for explanatory purposes of one embodiment and are not meant to limit the invention to any particular hardware configuration. Alternative embodiments may include additional or alternate components to perform the functionality described herein The subset of Bins being analyzed changes as the Bin window moves from lower to higher value Bins, i.e., from all 0's to all 1's. NCO 518 comprises a closed loop circuit with negative feedback that generates a gross slope rate of analog voltage ramp, and any instantaneous error, either present in a current or anticipated subset of Bins, is used as feedback to NCO 518 to correct for the analog ramp rate. This correction mechanism allows sliding-histogram window pointer 514 to always be synchronized with analog ramp voltage source 502. Additionally, NCO 518 also directs the movement of the subset Bin window based on the input voltage ramp rate in an open-loop NCO configuration or error plus ramp-rate in a closed-loop configuration.

In one embodiment, NCO 518 also includes a phased-lock loop (PLL) that provides incremental error or offset to sliding-histogram window pointer 514. The PLL may generate an output signal with a particular phase corresponding to the phase of an input "reference" signal. PLLs are generally well known to those skilled in the art and may include electrical devices such as a variable frequency oscillator and a phase detector.

When analog ramp voltage source 502 supplies a ramp voltage source to ADC 506, ADC 506 generates corresponding digital output codes (Bins) that are used by BIST component 504 to test the nonlinearity of ADC 506. The Bins are passed to several components on BIST component 504, including histogram window pointer 514, comparator 516, and NCO 518. Sliding-histogram window pointer 514 generates a center pointer to a subset of Bin values based on a guidance signal from NCO 518. Comparator 516 determines whether a Bin generated by ADC 508 is the same Bin being pointed to by histogram window pointer 514, and if not whether the generated Bin indicates a previous (left) or subsequent (right) Bin to the pointed-to Bin. Comparator 516 increments counters for left and right misses and enables binary encoder 524 to map the generated Bin to sliding histogram 526.

Each detected Bin is store is mapped by binary encoder 524 to a hardware register (shown as Bin0, Bin1 . . . Bin63) on sliding histogram 526. The shown hardware registers in sliding histogram 526 comprise a 64-bit hardware register capable of managing a subset of 64 different Bin codes. Controller 528 includes an ALU that calculates the average HPC, DNLs, and INLs for each Bin in a given subset. As the ramp analog voltage increases, the subset progresses to higher-numbered Bins and removes lower-numbered Bins, continually computing average DNLs, INLs, and maximum and minimum DNL and INL values for the Bins currently in the subset. Controller 528 determines whether the ADC is defective based on the calculated DNL and INL values for each Bin compared to maxima and minima values DNL and INL values for a given subset. As the subset window changes to include new Bins, so too will the DNL and INL maxima and minima calculations. To this end, BIST component 504 only needs to use a relatively low amount of memory for accumulator 530 to keep track of DNL and INL calculations, instead of having to use larger memory sources.

Every Bin with a DNL or INL that exceeds maxima and minima DNL and INL values, as determined either by previous DNL and INL calculations or preset as threshold DNL and INL values, triggers controller 528 to increment counter 532. If the counter value exceeds a specific threshold, BIST component 504 determines that SoC 500 is defective. Otherwise, if the subset window advances through every Bin code and counter 532 is not incremented beyond the threshold value, SoC 500 is determined to be functioning and performing in an acceptable manner. After ADC testing is completed for all Bins, state machine 508 may direct multiplexer 512 to switch the input to ADC 506 back to normal AC input 510.

Figure 6:
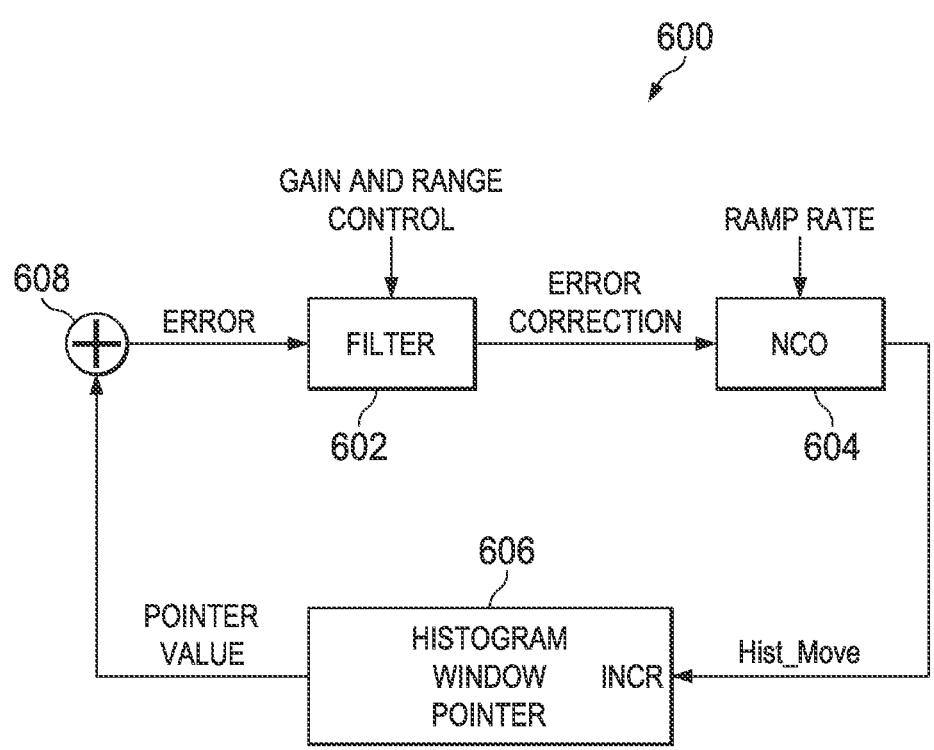
FIG. 6 illustrates a block diagram of a phase lock loop for setting a histogram pointer used to control a window for measuring binary outputs of an ADC, according to one embodiment.

FIG. 6 illustrates a block diagram of a PLL for setting a histogram pointer used to control a window for measuring binary outputs of an ADC, according to one embodiment. PLL 600 uses a filter 602, NCO 604, and histogram window pointer 606. NCO 604 is used for locking a histogram position with mean ADC output code. As an analog voltage ramp rises, the ADC output Bin code changes accordingly. Due to inherent noise, however, the ADC output will have some degree of error corresponding to the analog input. The mean ADC code is obtained by filtering the Bins. To combat the error, filter PLL 600 uses NCO 604. Histogram base pointer is incremented in sync with mean ADC code. At any point, the difference between a center pointer of the histogram and the ADC mean code is fed as error to PLL 600, allowing the histogram pointer to either be incremented faster or slower to maintain the phase synchronization.

PLL 600 can run in either open loop or closed loop. In one embodiment, PLL 600 runs in open loop in calibration phase to estimate the step size error and offset (histogram pointer initialization) error. In one embodiment, PLL 600 runs in close loop when the ramp input voltage is in a certain dynamic region of the ADC. The minimum Bin needing to appear at the ADC output to declare the input voltage is in dynamic range can be programmed using a particular register. One embodiment restricts PLL 600 from entering close loop mode until after the particular register is programmed to indicate the voltage is in the dynamic range. This precludes NCO 604 from entering close loop due to noise or glitches of the ADC data.

In another embodiment, PLL 600 can also be forced to always run in open loop mode by setting a specific register bit. In this embodiment, the error computed is limited between the programmable limits and filtered using a tap filter (e.g., 3-tap, 5-tap, etc.) before being sent to NCO 604. The step size at which NCO increments is programmable using another register that can be programmed based on the chosen ramp rate or slope and/or the ADC sampling frequency.

Figure 7:
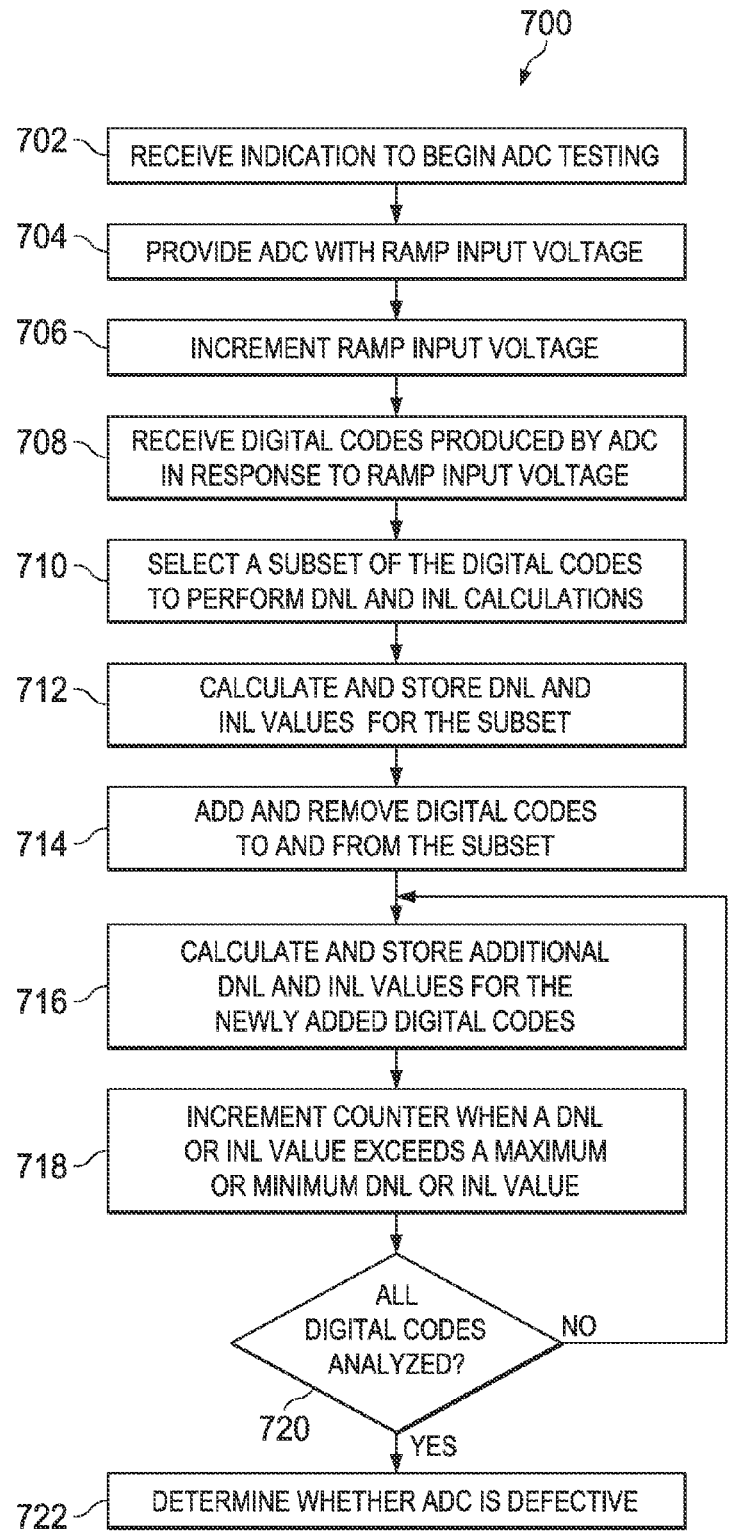
FIG. 7 is as flowchart diagram of a procedure for testing an ADC with a BIST, according to one embodiment.

FIG. 7 is a flowchart diagram of a procedure for testing an ADC with a BIST, according to one embodiment. Flow 700 begins when an indication to begin ADC testing is received, as shown at block 702. The indication may be initiated by a user or programmatically by a device in a testing facility. Once the indication is received, an analog ramp input voltage, ranging from an initial voltage value to FS, is provided to the ADC, as shown at block 704. The input voltage is incremented, as shown at block 706, and digital Bins are generated by the ADC in response to the input voltage, as shown at block 708. While the input voltage is being incremented, a subset of Bins are selected for performing DNL and INL calculations, as shown at block 710. The subset comprises merely a small sampling of Bins that can be produced by the ADC. Block 712 shows that DNL and INL calculations are computed and stored for each Bin in the subset. In one embodiment, the DNL and INL calculations are stored in hardware registers instead of external memory, saving space on the SoC.

Bins are added and removed from the subset as the input voltage ramps up, as shown at block 714. For each newly added digital code in the subset, DNL and INL values are calculated, as shown at block 716. DNL and INL values for the Bins in the subset are checked to see if they exceed maximum and minimum DNL and INL values, respectively, as shown at block 718. As previously mentioned, maximum and minimum DNL and INL values may be based on the average HPC for each Bin or may be predetermined based on linearity characteristics of an ideal ADC. Counters or other accumulators can be incremented whenever the maximum and minimum DNL or INL values are exceeded (either positively for the maximum or negatively for the minimum), and after all Bins have been analyzed, a determination is made as to whether the ADC is defective based on the counter values. The ADC may be deemed to be defective if the counter exceeds a threshold number, indicating the ADC experienced an unacceptable number of Bin hits exceeding the DNL or INL maximum and minimum.

It should be appreciated that the various embodiments disclosed herein are exemplary. Accordingly, various modifications to these embodiments may be made without departing from the scope of the present disclosure and the claims provided below. For example, although the disclosure is generally directed to a low supply voltage analog disconnect envelope detection application for detecting high differential voltage disconnect conditions, the disclosure may apply to other applications as well.

The subject matter of the present invention is described with specificity herein to meet statutory requirements. The description itself is not, however, intended to limit the scope of this patent. The claimed subject matter might also be embodied in other ways, to include different steps or combinations of steps similar to the ones described herein, in conjunction with other present or future technologies. Although the terms "block" may be used herein to connote different elements of methods employed, the terms should not be interpreted as implying any particular order among or between various steps herein disclosed unless and except when the order of individual steps is explicitly described.

What is claimed is:

1. A system for determining nonlinearity characteristics of an analog-to-digital converter (ADC), comprising:
 a built-in self-test (BIST) configured to determine differential nonlinearity (DNL) values for each digital code in a subset of digital codes generated by the ADC in response to an input analog voltage;
 a window synchronizer configured to add at least one digital code to the subset; and
 a controller configured to make a determination about the ADC based on one or more counters indicating a quantity of the DNL values exceeding at least one threshold DNL value.

2. The system of claim 1, wherein the controller is configured to calculate integral nonlinearity (INL) values for each code in the subset and increment the one or more counters based on the INL values exceeding an INL maximum or being less than an INL minimum.

3. The system of claim 2, wherein the INL values comprise a summation of the DNL calculations for preceding digital codes in the subset.

4. The system of claim 1, wherein the determination comprises an indication that the ADC is defective.

5. The system of claim 1, wherein the determination comprises an indication that the ADC is functioning properly.

6. The system of claim 1, wherein the DNL values are based on an average number of hits-per-code (HPC) associated with the digital output codes in the subset.

7. The system of claim 1, further comprising a histogram window pointer that receives a step size of a numerically controlled oscillator (NCO) and determines a pointer value corresponding to a portion of the input analog voltage for testing, wherein the pointer value points to a midpoint digital code in the subset.

8. The system of claim 1, further comprising a state machine configured to initiate supply of the input analog voltage to the ADC and incrementally change the input analog voltage from an initial voltage to full-scale voltage.

9. The system of claim 1, further comprising a numerically controlled oscillator (NCO) configured to to control incremental adjustments of the analog input voltage.

10. The system of claim 8, wherein the one or more counters are stored in one or more registers.

11. The system of claim 1, wherein the window synchronizer is configured to remove a second digital code from the subset.

12. A system for determining nonlinearity characteristics of an analog-to-digital converter (ADC) configured to receive an input analog voltage and responsively produce digital codes as outputs, comprising:
 a built-in self-test (BIST) portion configured to:
  (a) calculate differential nonlinear (DNL) calculations for each code in a subset of all digital codes the ADC can produce, and
  (b) increment one or more counters when any of the DNL calculations exceed a DNL maximum or are less than a DNL minimum,
 wherein a controller in the BIST determines the ADC is defective based on values in the one or more counters.

13. The circuit of claim 12, further comprising:
 a ramp source voltage configured to provide an input analog voltage that incrementally changes the input analog voltage from an initial voltage to a full-scale voltage; and
 a window synchronizer configured to add and remove codes in the subset as the input analog voltage changes.

14. The circuit of claim 12, wherein the ADC is determined to be defective based on a number of times the DNL calculations exceeded the threshold DNL maximum or are less than the threshold DNL minimum.

15. The circuit of claim 12, further comprising a state machine configured to change an input to the ADC to the analog input voltage and control the incremental changing of the analog input voltage.

16. The circuit of claim 12, wherein the BIST calculates integral nonlinearity (INL) calculations for each code in the subset.

17. The circuit of claim 12, wherein the BIST is configured to:
 increment the one or more counters when any of the INL calculations exceed an INL maximum or are less than an INL minimum, and
 determine the ADC is defective based on the DNL calculations and the INL calculations.

18. A method for testing an analog-to-digital converter (ADC) using a built-in self-test, comprising:
 determining a subset of digital codes from all digital codes the ADC can produce;
 calculating one or more nonlinearity values for each digital code in the subset generated by the ADC in response to an incrementally changing input analog voltage;
 as the input voltage changes, adding additional digital codes produced by the ADC to the subset and calculating additional nonlinearity values for the additional digital codes; and
 making a determination about the ADC based on one or more counters indicating a number of times the nonlinearity values and the additional nonlinearity values exceed nonlinearity thresholds.

19. The method of claim 18, wherein the nonlinearity values and the additional nonlinearity values comprise at least one member of a group comprising differential nonlinearity (DNL) values and integral nonlinearity (INL) values.

20. The method of claim 19, wherein the nonlinearity thresholds comprise a DNL maximum and a DNL minimum.

21. The method of claim 19, wherein the nonlinearity thresholds comprise an INL maximum and an INL minimum.

22. The method of claim 18, wherein the additional digital codes are selected based on the incrementally changing input analog voltage.

23. The method of claim 18, wherein the determination comprises an indication that the ADC is defective.

24. The method of claim 18, wherein the determination comprises an indication that the ADC is functioning properly.

25. The method of claim 18, wherein the determination is made by a controller in a built-in self test (BIST).

26. A system, comprising:
 an analog-to-digital converter (ADC) being supplied an incrementally changing input analog voltage and consequently producing a plurality of digital codes responsive to the incrementally changing analog voltage; and
 a controller configured to:
  a. select a subset of digital codes from all digital codes the ADC can produce,
  b. calculate nonlinearity values for each of the digital codes in the subset, c. increment a counter based on comparing the nonlinearity values to threshold nonlinearity values, and d. make a determination about the ADC based on the counter.

27. The system of claim 26, wherein the nonlinearity values and the new nonlinearity values comprise at least one member of a group comprising differential nonlinearity (DNL) values and integral nonlinearity (INL) values.

28. The system of claim 26, wherein the threshold nonlinearity values comprise a DNL maximum and a DNL minimum.

29. The system of claim 26, further comprising:

a ramp analog source configured to generate the incrementally changing input analog voltage;

a stale machine configured to initiate supply of the incrementally changing input analog voltage to the ADC; and a window synchronizer configured to modify the subset of digital codes based as the incrementally changing input analog voltage changes.

30. The system of claim 26, wherein the counter is maintained in one or more registers.

* * * * *

UNITED STATES PATENT AND TRADEMARK OFFICE
CERTIFICATE OF CORRECTION

| | | |
|---|---|---|
| PATENT NO. | : 8,803,716 B1 | Page 1 of 1 |
| APPLICATION NO. | : 13/859954 | |
| DATED | : August 12, 2014 | |
| INVENTOR(S) | : Ravindranath Ramalingaiah Munnan et al. | |

It is certified that error appears in the above-identified patent and that said Letters Patent is hereby corrected as shown below:

In the Specification:

At column 3, line number 36, please replace [is as flowchart] with -- is a flowchart --.

At column 9, line number 40, please replace [windows] with -- window --.

In the Claims:

At column 15, claim number 29, line number 15, please replace [stale] with -- state --.

Signed and Sealed this
Eighteenth Day of November, 2014

Michelle K. Lee
*Deputy Director of the United States Patent and Trademark Office*